United States Patent
Ye

(10) Patent No.: US 10,483,279 B2
(45) Date of Patent: Nov. 19, 2019

(54) METHOD OF MANUFACTURING A SEMICONDUCTOR DEVICE

(71) Applicant: INSTITUTE OF MICROELECTRONICS, CHINESE ACADEMY OF SCIENCES, Beijing (CN)

(72) Inventor: Tianchun Ye, Beijing (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 101 days.

(21) Appl. No.: 15/753,376

(22) PCT Filed: Nov. 23, 2015

(86) PCT No.: PCT/CN2015/095245
§ 371 (c)(1),
(2) Date: Feb. 19, 2018

(87) PCT Pub. No.: WO2017/028387
PCT Pub. Date: Feb. 23, 2017

(65) Prior Publication Data
US 2018/0240809 A1    Aug. 23, 2018

(30) Foreign Application Priority Data

Aug. 20, 2015    (CN) .......................... 2015 1 0514552

(51) Int. Cl.
*H01L 21/02*     (2006.01)
*H01L 27/11582*  (2017.01)
(Continued)

(52) U.S. Cl.
CPC .. *H01L 27/11582* (2013.01); *H01L 21/02592* (2013.01); *H01L 21/28282* (2013.01);
(Continued)

(58) Field of Classification Search
CPC .......... H01L 27/11582; H01L 29/7926; H01L 21/28282; H01L 21/324; H01L 21/30604;
(Continued)

(56) References Cited

U.S. PATENT DOCUMENTS

2017/0110470 A1*  4/2017  Rabkin .............. H01L 27/11582
2017/0250193 A1*  8/2017  Huo .................... H01L 21/3247

FOREIGN PATENT DOCUMENTS

CN    103545261    1/2014
CN    103730471    4/2014
(Continued)

*Primary Examiner* — Joseph C. Nicely
*Assistant Examiner* — Pavel G. Ivanov
(74) *Attorney, Agent, or Firm* — Dickinson Wright PLLC

(57) ABSTRACT

A method of manufacturing a semiconductor device, comprising the steps of: forming a gate dielectric layer and a first amorphous channel layer on a substrate; thinning the first amorphous channel layer; etching the first amorphous channel layer and the gate dielectric layer until the substrate is exposed; forming a second amorphous channel layer on the first amorphous channel layer and the substrate; annealing such that the first amorphous channel layer and the second amorphous channel layer are converted into a polycrystalline channel layer; and thinning the polycrystalline channel layer. According to the method of manufacturing semiconductor device of the present invention, the grain size of the polycrystalline thin film is increased by depositing a thick amorphous film and then annealing and thinning it. An additional protective layer is used to avoid etching damage on the sidewalls, effectively reducing the interface state and damage defects of the polycrystalline channel layer, thereby enhancing the reliability of the device.

10 Claims, 4 Drawing Sheets

(51) Int. Cl.
  *H01L 21/306* (2006.01)
  *H01L 21/324* (2006.01)
  *H01L 21/28* (2006.01)
  *H01L 29/792* (2006.01)

(52) U.S. Cl.
  CPC ...... *H01L 21/30604* (2013.01); *H01L 21/324* (2013.01); *H01L 29/7926* (2013.01); *H01L 21/02527* (2013.01); *H01L 21/02529* (2013.01); *H01L 21/02532* (2013.01); *H01L 21/02538* (2013.01); *H01L 21/02551* (2013.01); *H01L 21/02667* (2013.01)

(58) Field of Classification Search
  CPC ......... H01L 21/02592; H01L 21/02532; H01L 21/02667; H01L 21/02538; H01L 21/02529; H01L 21/02551; H01L 21/02527
  See application file for complete search history.

(56) References Cited

FOREIGN PATENT DOCUMENTS

| | | |
|---|---|---|
| CN | 104022120 | 9/2014 |
| CN | 104037175 | 9/2014 |
| CN | 104392963 | 3/2015 |

* cited by examiner

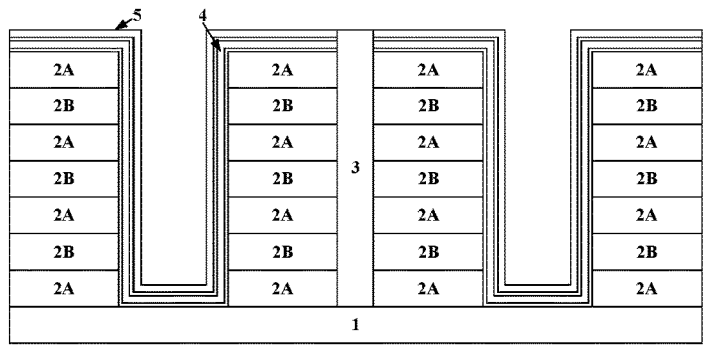
FIG. 1 – PRIOR ART
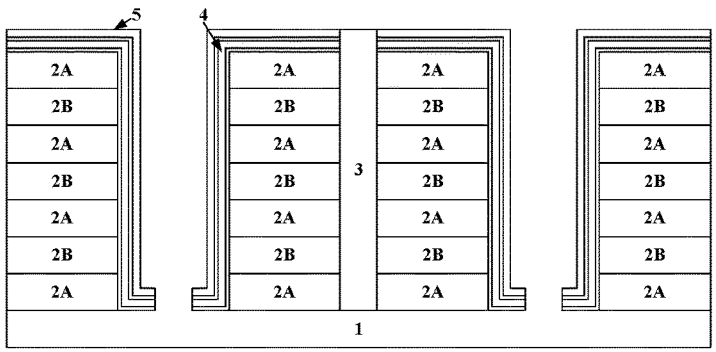
FIG. 2 – PRIOR ART
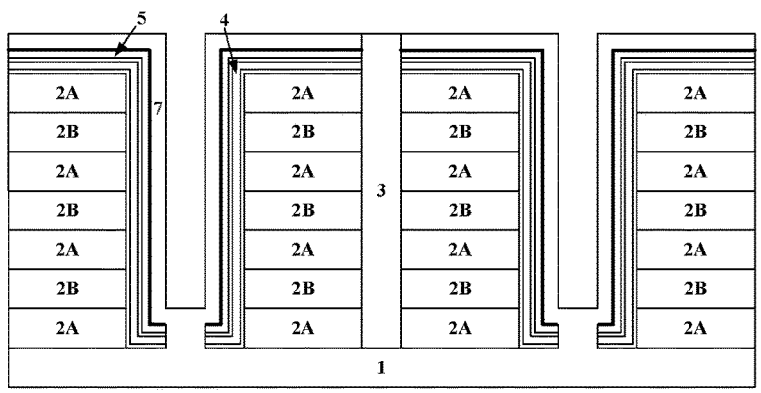
FIG. 3 – PRIOR ART
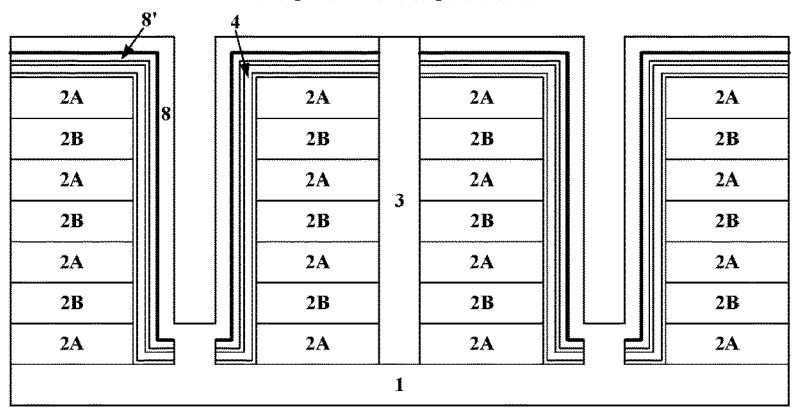
FIG. 4 – PRIOR ART

METHOD OF MANUFACTURING A SEMICONDUCTOR DEVICE

TECHNICAL FIELD

The present invention relates to a method of manufacturing a semiconductor device, particularly to a method of manufacturing a polycrystalline channel layer of three-dimensional memory.

BACKGROUND

In order to improve the density of memory device, the industry has worked extensively at developing a method for reducing the size of a two-dimensional arrangement of memory cells. As the size of the memory cells of two-dimensional (2D) memory devices continues to shrink, signal conflict and interference will significantly increase, so that it is difficult to perform operation of multi-level cell (MLC). In order to overcome the limitations of 2D memory devices, the industry has developed a memory device having a three-dimensional (3D) structure, to improve integration density by arranging the memory cells over the substrate three-dimensionally.

Due to its special three-dimensional structure and complicated process inheritance, three-dimensional memory can only use polycrystalline (silicon) materials instead of monocrystal (silicon) materials as its channel, wherein the grain size of polycrystalline (silicon) materials, the number of crystal grain boundary traps have become the key points limiting the channel conductivity. A high interface state makes the channel leakage larger, and meanwhile the impact of temperature changes on characteristics is great.

FIGS. 1 to 4 illustrate a method of manufacturing a three-dimensional memory in the prior art. Specifically, a stack comprised of different dielectric materials 2A/2B is deposited on substrate 1 to serve as a dummy gate, and then an insulating isolation layer 3 between memory cells is formed by etching openings between a plurality of dummy gate stacks and filling insulating material therein. The isolation layer 3 surrounds a plurality of active regions. The dummy gate stacks in the active regions are etched to form a plurality of channel trenches, and a layer of gate dielectric 4 is deposited into the trenches. A first amorphous channel layer 5, such as amorphous silicon, is conformally deposited on the gate dielectric 4 to act as a nucleation or interfacial layer for subsequent channel layer. The thickness of the layer 5 is very small, for example, only 0.2~5 nm. The quality of film 5 is poor due to inhomogeneous thickness and a large number of defects exist on the surface. Then, as shown in FIG. 2, the gate dielectric 4 is etched until the substrate 1 is exposed. In this etching process, the dry etching gas not only etches away the gate dielectric 4 at the bottom of the trenches, but also laterally etches the channel layer 5, worsening the defects and damage of its surface. During deposition of a second amorphous channel layer 7 shown in FIG. 3, damage defects on the surface of the first amorphous channel layer 5 will remain, resulting in a poor amorphous-amorphous interface between second amorphous channel layer 7, as shown in thick solid line in FIG. 3. Thus, during the subsequent process of annealing the amorphous silicon for converting it into polycrystalline channel layer as shown in FIG. 4, this kind of high interfacial state will affect the properties of the polycrystalline channel layer 8/8'.

SUMMARY OF THE INVENTION

From the above, the object of the present invention is to overcome the above-mentioned technical difficulties, and propose a method of manufacturing a three-dimensional memory, which can effectively reduce the interfacial state of the polycrystalline channel layer and damage defects, thereby effectively improving the reliability of the device.

To this end, in one aspect of the present invention, there is provided a method of manufacturing a semiconductor device, comprising the steps of: forming a gate dielectric layer and a first amorphous channel layer on a substrate; thinning the first amorphous channel layer; etching the first amorphous channel layer and the gate dielectric layer until the substrate is exposed; forming a second amorphous channel layer on the first amorphous channel layer and the substrate; annealing such that the first amorphous channel layer and the second amorphous channel layer are converted into a polycrystalline channel layer; and thinning the polycrystalline channel layer.

Wherein, the gate dielectric layer includes a plurality of sub-layers selected from a tunneling layer, a storage layer and a barrier layer.

Wherein, the first amorphous channel layer is selected from amorphous Si and amorphous Ge.

Wherein, the second amorphous channel layer is selected from amorphous Ge, amorphous SiGe, amorphous SiC, amorphous SiGeC, amorphous C, III-V group or II-VI group amorphous compound semiconductors, and combinations thereof.

Wherein, the second amorphous channel layer comprises a dopant, and the annealing activates the said dopant.

Wherein, after thinning the first amorphous channel layer and before etching the first amorphous channel layer, the method further comprises forming a protective layer on the first amorphous channel layer.

Wherein, the protective layer is a single layer or multi-layer structure.

Wherein, after etching to expose the substrate, and before forming the second amorphous channel layer, the method further includes removing the protective layer by etching.

Wherein, the step of forming the gate dielectric layer and the first amorphous channel layer on the substrate comprises forming a dummy gate stack on the substrate, etching the dummy gate stack to form a plurality of channel trenches perpendicular to the substrate, and sequentially depositing a gate dielectric layer and a first amorphous channel layer in each channel trench.

Wherein, after thinning the polycrystalline channel layer, the method further includes forming a plurality of source and drain regions on the upper and lower ends of the polycrystalline channel layer, removing the dummy gate stack, and forming a gate conductive layer on the sidewall of the gate dielectric layer.

Wherein, the temperature of annealing is 300~850° C., the annealing time is from 1 minute to 10 hours.

According to the method of manufacturing semiconductor device of the present invention, the grain size of the polycrystalline thin film is increased by depositing a thick amorphous film and then annealing and thinning it. An additional protective layer is used to avoid etching damage on the sidewall. It is possible to effectively reduce the interfacial state, damage defects of the polycrystalline channel layer, thereby enhancing the reliability of the device.

BRIEF DESCRIPTION OF THE DRAWINGS

The technical solutions of the present invention are described in detail below with reference to the accompanying drawings, in which:

FIGS. 1 to 4 are cross-sectional views of various steps of a method of manufacturing a three-dimensional memory device according to the prior art;

DETAILED DESCRIPTION

The features and technical effects of the present invention will be described in detail with reference to the drawings and schematic embodiments, disclosing a semiconductor device manufacturing method for effectively improving the reliability of the device. It should be noted that the similar reference numbers denote the similar structure. The terms used in the present invention like "first", "second", "up/upon", "down/low/beneath/under" etc. can be used in denoting various device structures, and do not indicate the relationship in space, sequence or hierarchy of the device structures unless specially illuminated these terms, if not stated otherwise.

Figure 5:
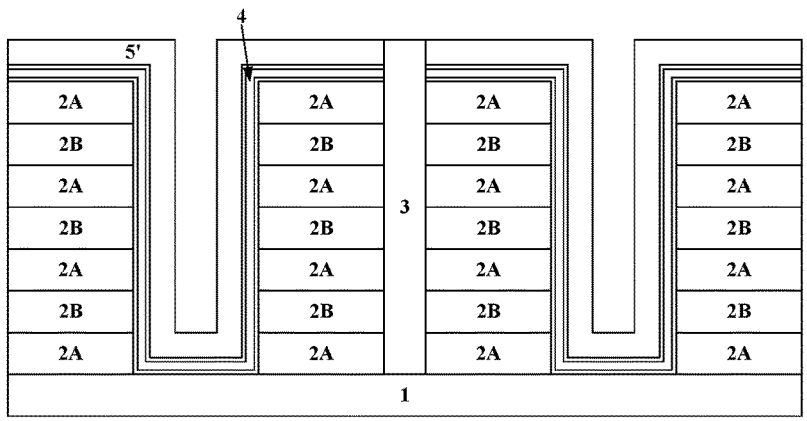
FIGS. 5 to 11 are cross-sectional views of various steps of a method of manufacturing a three-dimensional memory device according to the present invention.
Figure 12:
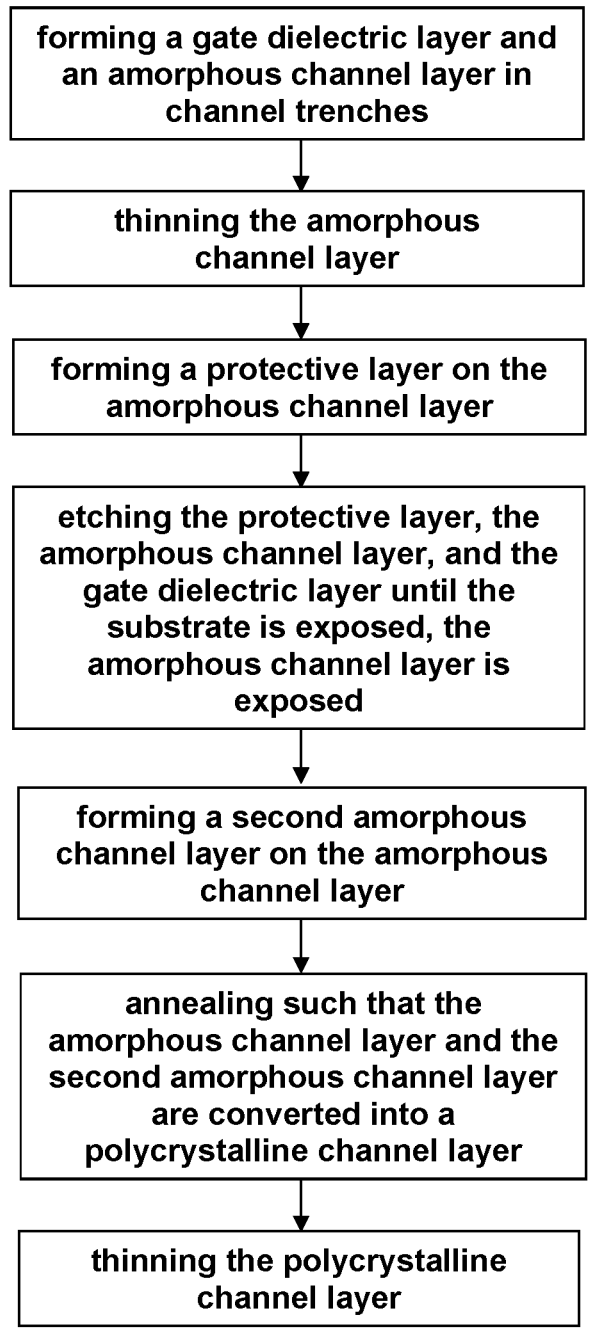
FIG. 12 is a schematic flowchart of a method of manufacturing a three-dimensional memory device according to the present invention.

As shown in FIG. 12 and FIG. 5, a gate dielectric layer 4 and a first amorphous channel layer 5' are formed in a plurality of channel trenches on a substrate 1.

A stacked structure 2 alternately composed of a plurality of first material layers 2A and a plurality of second material layers 2B is formed on the substrate 1. The materials of substrate 1 may comprise a bulk silicon (bulk Si), bulk germanium (bulk Ge), silicon-on-insulator (SOI), germanium-on-insulator (GeOI), or other compound semiconductor substrate, e.g., SiGe, SiC, GaN, GaAs, InP and the like, and combinations of these substances. For compatibility with the existing IC fabrication process, the substrate 1 is preferably a substrate containing silicon materials, e.g., Si, SOI, SiGe, Si:C and the like. The materials of the stacked structure 2 are selected from combination of the following materials and comprise at least one type of the insulating dielectric: e.g. silicon oxide, silicon nitride, polycrystalline silicon, amorphous silicon, amorphous carbon, amorphous diamond-like carbon (DLC), germanium oxide, aluminum oxide, aluminum nitride, metals or the like and combinations thereof. The first material layers 2A have a first etch selectivity, and the second material layers 2B have a second etch selectivity which is different from the first etch selectivity (e.g., The ratio of the two is greater than 5:1 and preferably greater than 10:1). In a preferred embodiment of the present invention, each sub-layer of the stacked structures 2A/2B is of non-conductive material, and a combination of the layers 2A/2B is for example a combination of silicon oxide and silicon nitride, a combination of silicon oxide and (non-doped) polysilicon or amorphous silicon, a combination of silicon oxide or silicon nitride and amorphous carbon, and the like. In a preferred embodiment of the invention, the layers 2A have a relatively greater etching selectivity ratio (for example greater than 5:1) to layers 2B under wet etching conditions or oxygen plasma dry etching conditions. The methods for depositing layers 2A and 2B comprise PECVD, LPCVD, HDPCVD, MOCVD, MBE, ALD, thermal oxidation, evaporation, sputtering, and other processes. In an optimized embodiment of the invention, layers 2A are of silicon dioxide and layers 2B are of silicon nitride.

The stacked structure (of dummy gate) 2 is etched in the array region until the substrate 1 is exposed, a plurality of dummy gate openings (or refer to as first openings, the one in the center of FIG. 5) are formed and a filling layer 3 is formed therein (the substrate under the filling layer 3 will constitute a plurality of common source regions formed later). Preferably, the stacked structure 2 comprised of layers 2A/2B is anisotropically etched by RIE or plasma dry etching to form openings exposing the substrate 1 and sidewalls of the layers 2A/2B alternately stacked on the substrate 1 (not shown). The etching gas is, for example, a fluorocarbon-based etching gas against to materials such as silicon dioxide and silicon nitride, and forms a plurality of temporary protective spacers comprised of a C-containing polymer on the sidewalls by increasing the ratio of carbon to fluorine, finally obtaining good vertical side walls. In a preferred embodiment of the present invention, the etching gas preferably contains relatively high amount of C, such as $C_3F_6$, $C_4F_8$, and further preferably, the side wall morphology is controlled by adding oxidizing gases such as $O_2$, CO. The cross-sectional shapes of the openings or trenches cut parallelly to the surface of the substrate 1 may be various geometry such as rectangular, square, diamond, circle, semi-circle, oval, triangle, pentagon, pentagon, hexagon, octagon, etc. The deposition method of the filling layer 3 includes PECVD, HDPCVD, MOCVD, MBE, ALD, evaporation, sputtering and the like. The material of filling layer 3 is preferably a material having high selectivity with respect to both the layers 2A and 2B of the stacked structure 2, for instance, the etching selectivity ratio between every two among layers 3, 2A, and 2B is greater than or equal to 5:1. In a preferred embodiment of the present invention, layers 2A are of silicon oxide, layers 2B are of silicon nitride, and filler layer 3 is of amorphous germanium, amorphous carbon, DLC, silicon oxynitride and the like, and vice versa.

Next, the stacked structure 2 comprised of layers 2A/2B is anisotropically etched by RIE or plasma dry etching, similar to the process of etching to form the first openings, and a plurality of second openings exposing the substrate 1 and sidewalls of the layers 2A/2B which are alternately stacked on the substrate 1 are formed around the first openings (there are 2 second openings located at each edge position in FIG. 5 which are open openings). The etching gas is, for example, a fluorocarbon-based etching gas against materials such as silicon dioxide and silicon nitride, and forms a plurality of temporary protective spacers comprised of C-containing polymer on the sidewalls by increasing the ratio of carbon to fluorine, finally obtaining good vertical sidewall. In a preferred embodiment of the present invention, the etching gas preferably contains relatively high amount of C, such as $C_3F_6$, $C_4F_8$, and further preferably, the sidewall morphology is controlled by adding oxidizing gases such as $O_2$, CO, etc. In a preferred embodiment of the invention (not shown in FIG. 5), the size (e.g. diameter) of the first openings for exposing the common source regions is greater than or equal to that of the second openings for forming the channel regions, for example the ratio of the two dimensions (diameter or the maximum span of the polygons) is greater than 1.5 and preferably greater than or equal to 2. In one embodiment of the present invention, there are six second openings around each of the first openings in order to improve the efficiency and uniformity of the later lateral etching of layers 2B.

After that, a gate dielectric layer 4 is formed in the second openings. The deposition method of the gate dielectric layer 4 includes PECVD, HDPCVD, MOCVD, MBE, ALD, evaporation, sputtering and the like. As shown in the FIG-ure, layer 4 preferably further comprises a plurality of sub-layers, such as a tunneling layer, a storage layer, and a barrier layer. Wherein the tunneling layer includes $SiO_2$ or a high-k material, wherein the high-k material includes but is not limited to nitrides (e.g. SiN, SiON, AlN, TiN), metal oxides (mainly oxides of subgroups metal and lanthanide metal elemental, such as MgO, $Al_2O_3$, $Ta_2O_5$, $TiO_2$, ZnO, $ZrO_2$, $HfO_2$, $CeO_2$, $Y_2O_3$, $La_2O_3$), oxynitrides (eg, HfSiON), perovskite oxides (such as $PbZr_xT_{1-x}O_3$ (PZT), $Ba_xSr_{1-x}TiO_3$ (BST)), and the like. The tunneling layer may be a single layer structure or a multi-layer stack structure of the above materials. The memory layer is of a dielectric material having charge trapping capability, such as SiN, $HfO_x$, $ZrO_x$, $YO_x$, and the like, and a combination thereof, and may also be a single layer structure or a multi-layer stack structure of the above materials. The barrier layer may be a single-layer structure or a multi-layer stacked structure of a dielectric material such as silicon oxide, aluminum oxide, hafnium oxide, or the like. In one embodiment of the present invention, the gate dielectric layer 4 is, for example, an ONO structure made of silicon oxide, silicon nitride, and silicon oxide.

Next, a first amorphous channel layer 5' is formed on the gate dielectric layer 4. The material of the first amorphous channel layer 5' is, for example, amorphous silicon or amorphous germanium, and the deposition process thereof includes LPCVD, PECVD, HDPCVD, MOCVD, MBE, ALD and the like. In one embodiment of the present invention, the first amorphous channel layer 5' is deposited by partially filling the sidewalls of the second openings to form a plurality of hollow cylinders with an air gap therein. In other embodiments of the present invention, the deposition process of the first amorphous channel layer 5' is selected to completely or partially fill the second openings to form a plurality of solid pillars, hollow rings, or core-shell structures comprised of hollow rings filled with an insulating layer (not shown). The shape of the horizontal cross-section of the first amorphous channel layer 5' is similar to and preferably conformal to that of the second openings, and may be various geometry such as solid rectangle, square, diamond, circle, semicircle, ellipse, triangle, pentagonal, hexagonal, octagonal, etc., or a hollow ring-shaped, barrel-like structure (and the inside of which may be filled with an insulating layer) evolved from the above geometrical shapes.

The process shown in FIG. 5 is different from that shown in FIG. 1 in that the applicant realizes through rigorous theoretical derivation and rigorous experimental verification that the thickness of first amorphous channel layer in the prior art is so thin that the deposited film quality is poor, the grain size is too small, and the density of defect state of the polycrystalline film formed by subsequent annealing is too large. Therefore, the applicant has specially designed to increase the thickness of the first amorphous channel layer 5' (preferably larger than the maximum crystal grain size of the amorphous material obtained by the deposition process), for example, 5 to 30 nm, which is larger than the thickness of the first amorphous channel layer 5 required in FIG. 1 and FIG. 6. In this way, it is possible to have sufficient time and space for the amorphous material to fuse into crystallites at the position close to the gate dielectric layer 4 or to increase the average size of the crystal grains during the successive deposition cycles, so that the closer to the gate dielectric layer 4, the better the film quality of the amorphous layer 5'.

Figure 6:
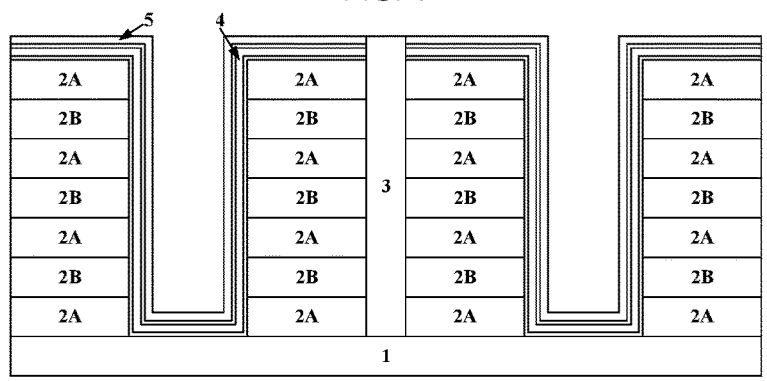

Subsequently, as shown in FIG. 12 and FIG. 6, the first amorphous channel layer 5' is thinned to become a first amorphous channel layer 5. Preferably by using isotropic etching, for example, with KOH, TMAH against amorphous silicon, or a mixed solution of strong acid and strong oxidant against amorphous germanium, the thickness of the first amorphous channel layer 5' between 5 and 30 nm is reduced to the thickness of first amorphous channel layer 5 between 0.2 and 5 nm, that is also the thickness of the nucleation layer or the interface layer required for the subsequent process (this thickness may be close to or smaller than the maximum grain size of the amorphous material obtained in the deposition process shown in FIG. 5). In this process, the amorphous channel layer 5 left after thinning will have a better average film quality than the original thick film 5' due to the significantly better quality of the film adjacent to the gate dielectric layer 4, which facilitates the subsequent film growth.

Figure 7:
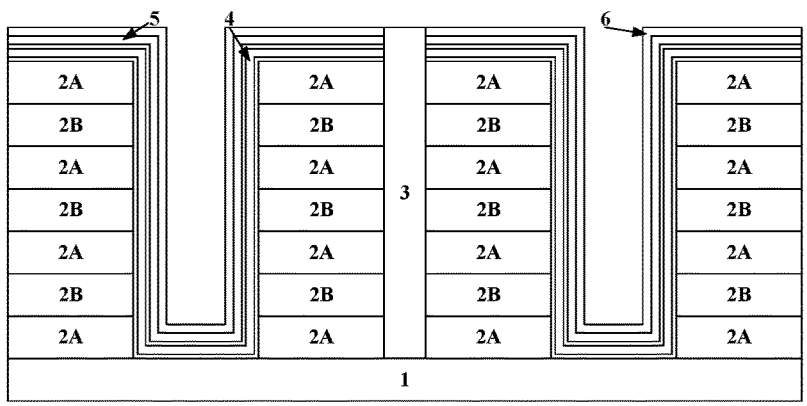

Optionally, as shown in FIG. 12 and FIG. 7, a protective layer 6 is formed on the thinned first amorphous channel layer 5. The material of the protective layer 6 is selected to have a high etching selectivity (e.g. an etching selectivity ratio of 5:1 or more, preferably 10:1 or more, and optimize 15:1 or more) to the layer 5, e.g silicon oxide, silicon nitride, silicon oxynitride, amorphous carbon, DLC, ta-C and the like. The protective layer 6 may be a single-layer structure or a multi-layer structure composed of a plurality of materials. The thickness of the protective layer 6 is preferably thin, for example 1 to 5 nm. The deposition process of the protective layer 6 is preferably conformal deposition, such as LPCVD, PECVD, HDPCVD, MOCVD, MBE, ALD, magnetron sputtering and the like.

Figure 8:
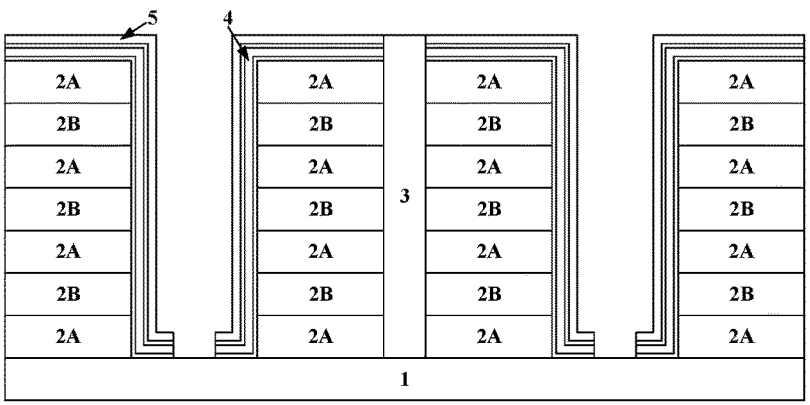

Subsequently, as shown in FIG. 12 and FIG. 8, the protective layer 6, the first amorphous channel layer 5 and the gate dielectric layer 4 are etched until the substrate 1 is exposed. The etching process is preferably anisotropic dry etching, such as plasma dry etching, reactive ion etching (RIE), using the etching gases such as fluorocarbon-based gases, optionally further including an oxidizing gas to adjust etching rate. The etching gas is adjusted so that the etching rate in the vertical direction is significantly greater than the lateral etching rate in the horizontal direction. For example, the etching rate ratio is greater than or equal to 5, preferably greater than or equal to 10, and optimize equal to or greater than 15. In this way, the sidewalls of the first amorphous channel layer 5 are not corroded by the etching gas due to protection of the protective layer 6 against the etch gas. So compared with the prior art shown in FIG. 2, the surface defect is reduced and the reliability of the device is further improved. After the substrate 1 is exposed, the protective layer 6 is completely removed using an isotropic wet process to expose the surface of the first amorphous channel layer 5.

Figure 9:
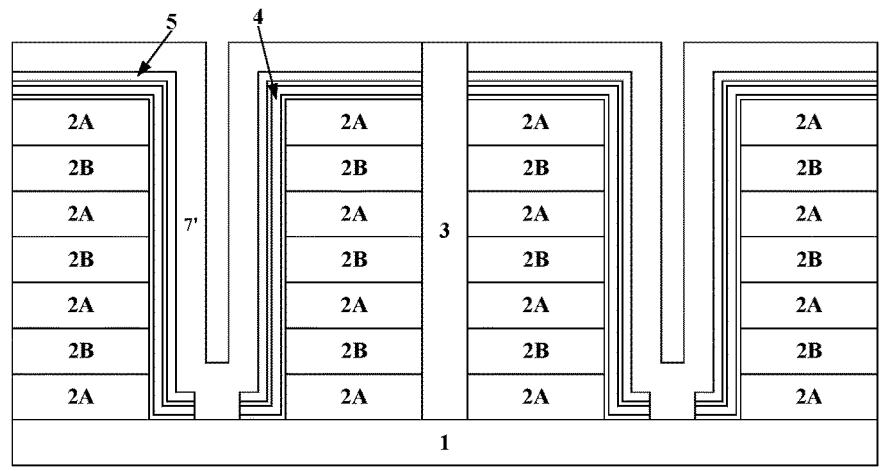

Next, as shown in FIG. 12 and FIG. 9, a second amorphous channel layer 7' is formed on the first amorphous channel layer 5. The second amorphous channel layer 7' is deposited using a process similar to the first amorphous channel layer 5, such as LPCVD, PECVD, HDPCVD, MOCVD, MBE, ALD, and the like. In a preferred embodiment of the invention, the layer 7' is of the same material as the layer 5, for example, either amorphous Si or amorphous Ge. In other embodiments of the present invention, the material of the layer 7' may be different from that of the layer 5. For example, when the layer 5 is of amorphous Si, the layer 7' is of amorphous Ge, amorphous SiGe, amorphous SiC, amorphous SiGeC, amorphous C, or a Group III-V or Group II-VI amorphous compound semiconductor, or the layer 7' is a laminate of amorphous silicon and other amorphous materials above. As a result, the channel layer formed after subsequent polycrystallization will have stress due to the lattice mismatch between different materials, thereby increasing the carrier mobility and improving the driving performance of the device. In still other embodiments of the present invention, the layer 7' may be doped after deposition or doped in-situ with n or p-type impurities to form different types of MOSFETs. Similar to the process shown in FIG. 5, in the preferred embodiment of the present invention, the thickness of layer 7' is significantly greater than that of the amorphous layer finally required, thereby increasing the grain size at the interface by utilizing the variation of grain size with the thickness of deposited films, and reducing the density of defect at the interface. For example, the thickness of the layer 7' is from 5 to 100 nm. By increasing the initial film thickness and increasing the interface grain size shown in FIG. 5 and FIG. 6, as well as using a protective layer to reduce etching damage shown in FIG. 7 and FIG. 8, the quality of the amorphous material interface between the first amorphous layer 5 and the second amorphous layer 7' shown in FIG. 9 is better (than that illustrated with thick solid lines as shown in FIG. 3 and FIG. 4), reducing the density of interface state defects.

Figure 10:
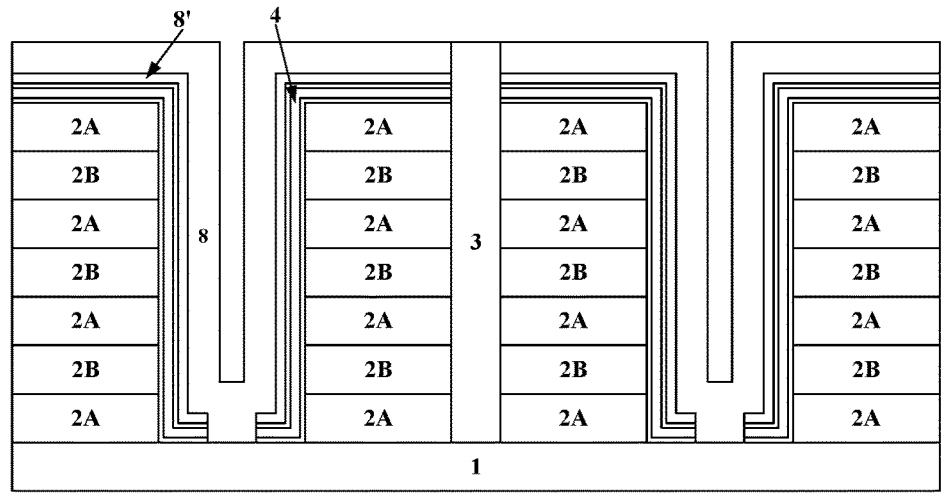

Subsequently, as shown in FIG. 12 and FIG. 10, the first amorphous channel layer 5 and the second amorphous channel layer 7' are converted into a polycrystalline channel layer 8/8' by annealing. When both layers 5 and 7' are of amorphous Si, layer 8/8' is of polysilicon. When the layers 5 and 7' are different in material, the layer 8/8' may be a laminate or a mixture of polysilicon and other polycrystalline materials (by material diffusion or alloying reaction during annealing). Other polycrystalline materials include polycrystalline Ge, polycrystalline SiGe, polycrystalline SiC, polycrystalline SiGeC, or group III-V or II-VI polycrystalline compound semiconductors. The thickness of the polycrystalline layer 8 is approximately equal to that of the layer 7', for example also from 5 to 100 nm, or has a thickness difference of less than 10%, preferably less than 5%. Simultaneously with the annealing, if the layer 7' has a dopant, the polycrystallization annealing activates the dopant at the same time so that the channel layer has a certain background doping concentration. The annealing temperature is, for example, 300 to 850° C. The grain size of the channel is controlled by a low-temperature process to reduce the leakage current. The annealing time is, for example, from 1 minute to 10 hours.

Figure 11:
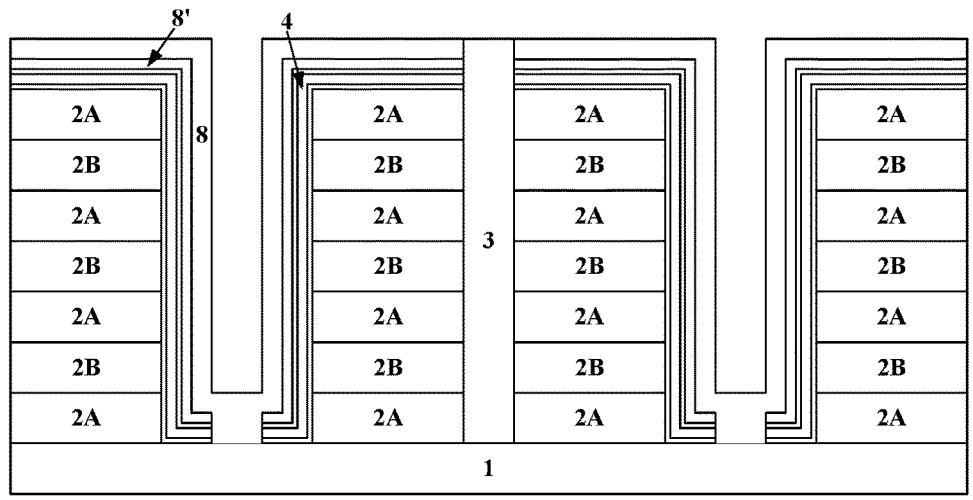

Next, as shown in FIG. 12 and FIG. 11, the polycrystalline channel layer 8/8' is thinned. For example, an isotropic etching process is used to thin the polycrystalline channel layer to a desired thickness of, for example, 5 to 20 nm. Follow-up process can be further implemented, completing the manufacturing of device.

For example, an insulating isolation layer (not shown) is filled inside the channel layer 8, for instance, a silicon oxide layer is formed by processes such as LPCVD, PECVD and HDPCVD to support, insulate and isolate the channel layer 8. After that, a plurality of drain contacts are deposited on top of the channel layer 8. Preferably, a material of the same or similar material with the channel layer 8 (for example, SiGe, SiC or the like similar to Si for fine tuning the lattice constant to improve carrier mobility in order to control the driving performance of the device) is deposited on top of the second openings to form drain regions of the memory cell unit transistor, and a silicide (not shown) may be further formed to reduce the contact resistance.

The filling layer 3 is removed by selective etching, the first openings are exposed again, and the second material layers (dummy gate layers) 2B in the stacked structure are removed by lateral etching through the first openings. Subsequently, using an isotropic dry etch process, layers 2B are removed by lateral etching, leaving a plurality of lateral recesses between layers 2A. For instance, the layers 2B of silicon nitride are laterally etched by reducing the ratio of carbon to fluorine, or corroded with hot phosphoric acid. Alternatively, an HF-based etching solution may be used when layers 2A are of silicon nitride and layers 2B are of silicon oxide.

A plurality of common source regions are formed at the bottom of the first openings, and a plurality of gate conductive layers (not shown) are formed in the recesses. The source regions may be formed by ion implantation doping, and preferably further forming a metal silicide (not shown) on the surface. The material of metal silicide is, for example, $NiSi_{2-y}$, $Ni_{1-x}Pt_xSi_{2-y}$, $CoSi_{2-y}$ or $Ni_{1-x}Co_xSi_{2-y}$, wherein x is greater than 0 and less than 1, and y is greater than or equal to 0 and less than 1, respectively. The gate conductive layers may be of polysilicon, poly-SiGe, or metal, wherein the metal may include Co, Ni, Cu, Al, Pd, Pt, Ru, Re, Mo, Ta, Ti, Hf, Zr, W, Ir, Eu, Nd, Er, La, etc., alloys of these metals, and nitrides of these metals. Elements such as C, F, N, O, B, P and As may also be doped in the gate conductive layers to adjust work function. A plurality of barrier layers (not shown) of nitride are also preferably formed between the gate insulating layer 4 and the gate conductive layers by conventional methods such as PVD, CVD, ALD, and the like, and the material of the barrier layer is $M_xN_y$, $M_xSi_yN_z$, $M_xAl_yN_z$, and $MaAl_xSi_yN_z$, where M is Ta, Ti, Hf, Zr, Mo, W or other elements. Likewise, the gate conductive layers may be a single layer structure or a multi-layer stacked structure. After that, a plurality of source and drain contacts and interlayer dielectric layers are formed, completing the contacts and interconnects of the device.

According to the method of manufacturing semiconductor device of the present invention, by depositing a thick amorphous film then thinning and annealing it to increase the grain size of the polycrystalline thinned film, and using an additional protective layer to avoid etching damage on the sidewalls, it is possible to effectively reduce the interfacial state and damage defects of the polycrystalline channel layer, thereby enhancing the reliability of the device.

Although the present invention is descried with one or more exemplary embodiments, one skilled in the art will recognize that various appropriate changes and equivalents of the device structures can be made without departing from the scope of the present invention. Furthermore, a great deal of modifications of specific situation or materials can be made to the disclosed enlightenment without departing from the scope of the present invention. Thus, the intent of the present invention is not limited to the disclosed illustrative examples for implementing the best embodiments. The disclosed device structures and the method of manufacturing the same will include all the exemplary embodiments within the scope of the invention.

What is claimed is:

1. A method of manufacturing a semiconductor device, comprising the steps of:
   forming a gate dielectric layer and a first amorphous channel layer on a substrate;
   thinning the first amorphous channel layer;
   etching the first amorphous channel layer and the gate dielectric layer until the substrate is exposed;
   forming a second amorphous channel layer on the first amorphous channel layer and the substrate;
   annealing such that the first amorphous channel layer and the second amorphous channel layer are converted into a polycrystalline channel layer;
   thinning the polycrystalline channel layer.

2. The method according to claim 1, wherein, the gate dielectric layer includes a plurality of sub-layers selected from a tunneling layer, a storage layer and a barrier layer.

3. The method according to claim 1, wherein, the first amorphous channel layer is selected from amorphous Si or amorphous Ge.

4. The method according to claim 1, wherein, the second amorphous channel layer is selected from amorphous Ge, amorphous SiGe, amorphous SiC, amorphous SiGeC, amorphous C, group III-V or group II-VI amorphous compound semiconductors, and combinations thereof.

5. The method according to claim 1, wherein, the second amorphous channel layer comprises a dopant, and the annealing activates the said dopant.

6. The method according to claim 1, wherein, after thinning the first amorphous channel layer and before etching the first amorphous channel layer, the method further comprises forming a protective layer on the first amorphous channel layer, the protective layer is a single layer or multi-layer structure.

7. The method according to claim 6, wherein, after etching to expose the substrate, and before forming the second amorphous channel layer, the method further includes removing the protective layer by etching.

8. The method according to claim 1, wherein, the step of forming the gate dielectric layer and the first amorphous channel layer on the substrate comprises forming a dummy gate stack on the substrate, etching the dummy gate stack to form a plurality of channel trenches perpendicular to the substrate, sequentially depositing a gate dielectric layer and a first amorphous channel layer in each channel trench.

9. The method according to claim 8, wherein, after thinning the polycrystalline channel layer, the method further includes forming a plurality of source and drain regions on the upper and lower ends of the polycrystalline channel layer, removing the dummy gate stack, and forming a gate conductive layer on the sidewalls of the gate dielectric layer.

10. The method according to claim 1, wherein, the temperature of annealing is 300~850° C., the annealing time is from 1 minute to 10 hours.

* * * * *